United States Patent
Norris et al.

(10) Patent No.: US 8,937,794 B2
(45) Date of Patent: Jan. 20, 2015

(54) SORT PROBE OVER CURRENT PROTECTION MECHANISM

(71) Applicants: Benjamin J. Norris, Portland, OR (US); Pooya Tadayon, Portland, OR (US); Mark W. Dryfuse, Hillsboro, OR (US)

(72) Inventors: Benjamin J. Norris, Portland, OR (US); Pooya Tadayon, Portland, OR (US); Mark W. Dryfuse, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 196 days.

(21) Appl. No.: 13/630,114

(22) Filed: Sep. 28, 2012

(65) Prior Publication Data

US 2014/0092505 A1  Apr. 3, 2014

(51) Int. Cl.
*H02H 9/02* (2006.01)
*H02H 9/04* (2006.01)

(52) U.S. Cl.
CPC *H02H 9/02* (2013.01); *H02H 9/045* (2013.01)
USPC ............................................................. 361/57

(58) Field of Classification Search
USPC ............................................................. 361/57
See application file for complete search history.

(56) References Cited

U.S. PATENT DOCUMENTS

| | | | |
|---|---|---|---|
| 6,562,636 B1* | 5/2003 | Richmond et al. | 438/14 |
| 7,609,080 B2* | 10/2009 | Miller et al. | 324/757.01 |
| 2004/0046542 A1* | 3/2004 | Paterson | 324/96 |
| 2010/0164519 A1* | 7/2010 | Sellathamby et al. | 324/754 |

FOREIGN PATENT DOCUMENTS

EP    1770842 A1 *  4/2007 ............. G01R 15/24

* cited by examiner

*Primary Examiner* — Jared Fureman
*Assistant Examiner* — Kevin J Comber
(74) *Attorney, Agent, or Firm* — Blakely, Sokoloff, Taylor & Zafman LLP

(57) ABSTRACT

An apparatus includes a probe card, a plurality of sort probes coupled to the probe card and detector circuitry to detect a real time over current occurrence at the sort probes.

13 Claims, 6 Drawing Sheets

SORT PROBE OVER CURRENT PROTECTION MECHANISM

FIELD OF THE INVENTION

The present disclosure generally relates to wafer probe testing.

BACKGROUND

In the manufacture of semiconductor devices, it is necessary that such devices be tested at the wafer level to evaluate their functionality. The process in which die in a wafer are tested is commonly referred to as "wafer sort." Testing and determining design flaws at the die level offers several advantages. First, it allows designers to evaluate the functionality of new devices during development.

Increasing packaging costs also make wafer sorting a viable cost saver, in that reliability of each die on a wafer may be tested before incurring the higher costs of packaging. Measuring reliability also allows the performance of the production process to be evaluated and production consistency rated, such as for example by "bin switching" whereby the performance of a wafer is downgraded because that wafer's performance did not meet the expected criteria.

The process of die-testing and wafer sort may be carried out with a wafer probe card. A probe card is an interface between an electronic test system and a semiconductor wafer. Typically the probe card is mechanically docked to a prober and electrically connected to a tester to provide an electrical path between the test system and the circuits on the wafer, thereby permitting the testing and validation of the circuits at the wafer level, usually before they are diced and packaged.

Periodically, sort probe over current events may result in probe head damage due to melted or recessed probes. The damaged probes must be repaired or removed to prevent improper binning. In severe instances, the entire probe head, which may be valued at several tens of thousands of dollars, will need to be discarded as the damage is beyond repair. In cases where repair is viable, however, the repair process requires specially trained technicians to manually manipulate or pluck probes working under a microscope. Thus, the repair process is labor intensive and a production limiter as probe cards scale to tighter pitches and higher probe counts.

DETAILED DESCRIPTION

In the following description, numerous specific details are set forth in order to provide a thorough understanding of various embodiments. However, various embodiments of the invention may be practiced without the specific details. In other instances, well-known methods, procedures, components, and circuits have not been described in detail so as not to obscure the particular embodiments of the invention.

Reference in the specification to "one embodiment" or "an embodiment" means that a particular feature, structure, or characteristic described in connection with the embodiment may be included in at least an implementation. The appearances of the phrase "in one embodiment" in various places in the specification may or may not be all referring to the same embodiment.

Figure 1:
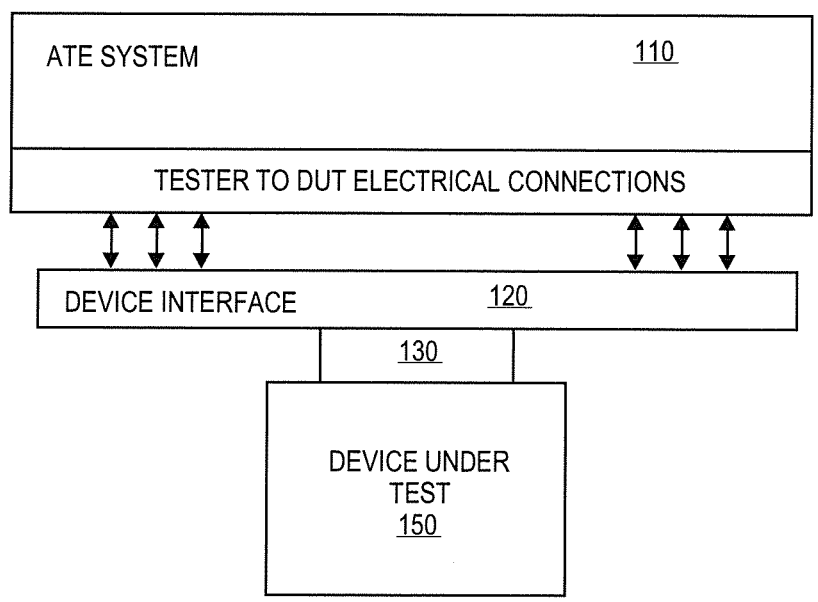
FIG. 1 illustrates one embodiment of a test system.

FIG. 1 illustrates one embodiment of a test system 100. System 100 includes an automated test equipment (ATE) system 110 implemented to perform testing on a device under test (DUT) 150. DUT 150 may be an IC die on a wafer, or a packaged part. In one embodiment, ATE system 110 is coupled to DUT 150 via a device interface 120 and probe card 130.

Figure 2:
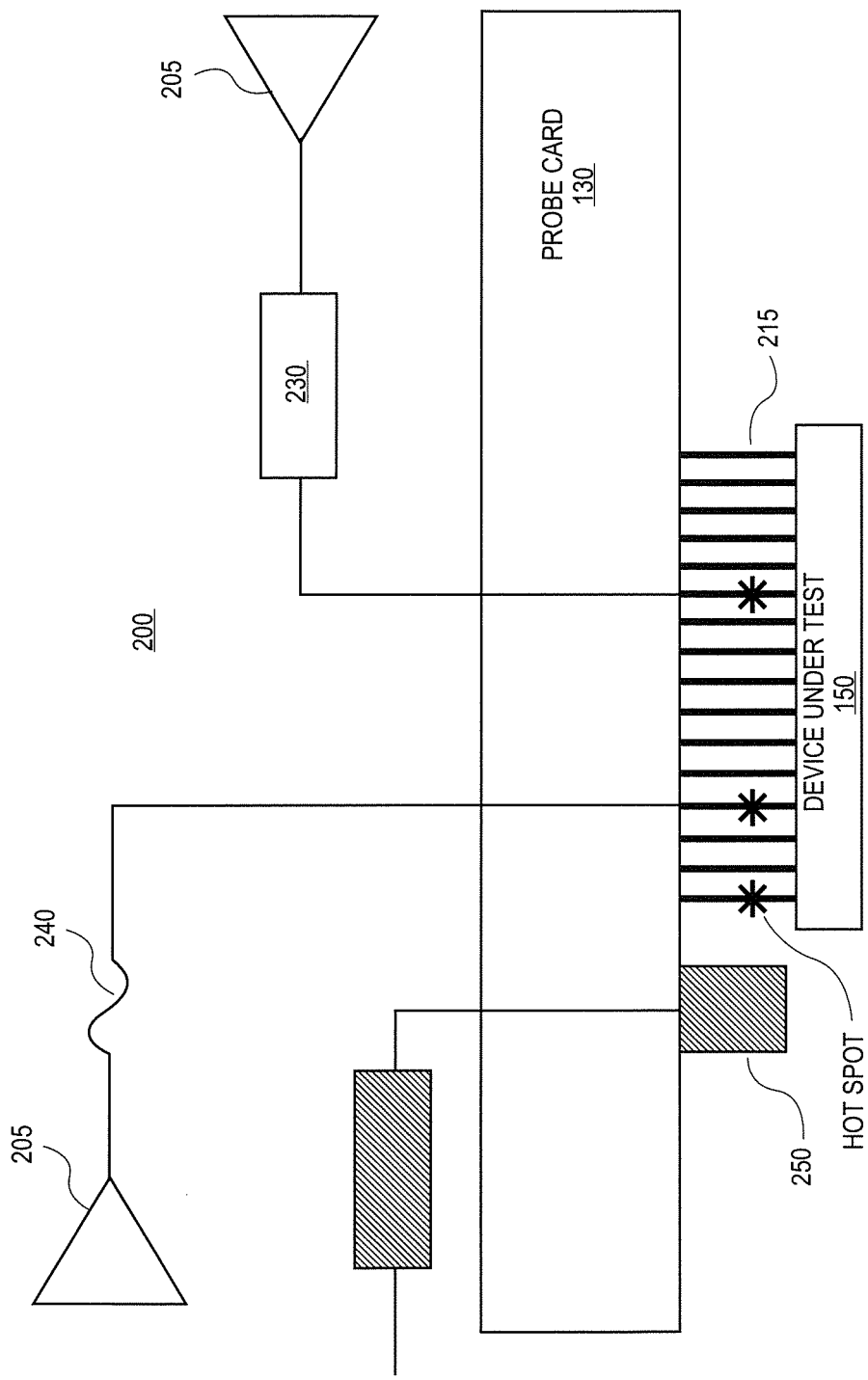
FIG. 2 illustrates one embodiment of a probe card.

FIG. 2 illustrates another embodiment of a test system 200 in which a sort probe card 130 is implemented to couple to DUT 150 via sort probes 215, while being powered by a power supply 205 from an ATE system. Additionally, test system 200 includes shunting e-fuse 230, thermal fuse 240, over current detector 250 and threshold detector circuit 255.

Figure 3:
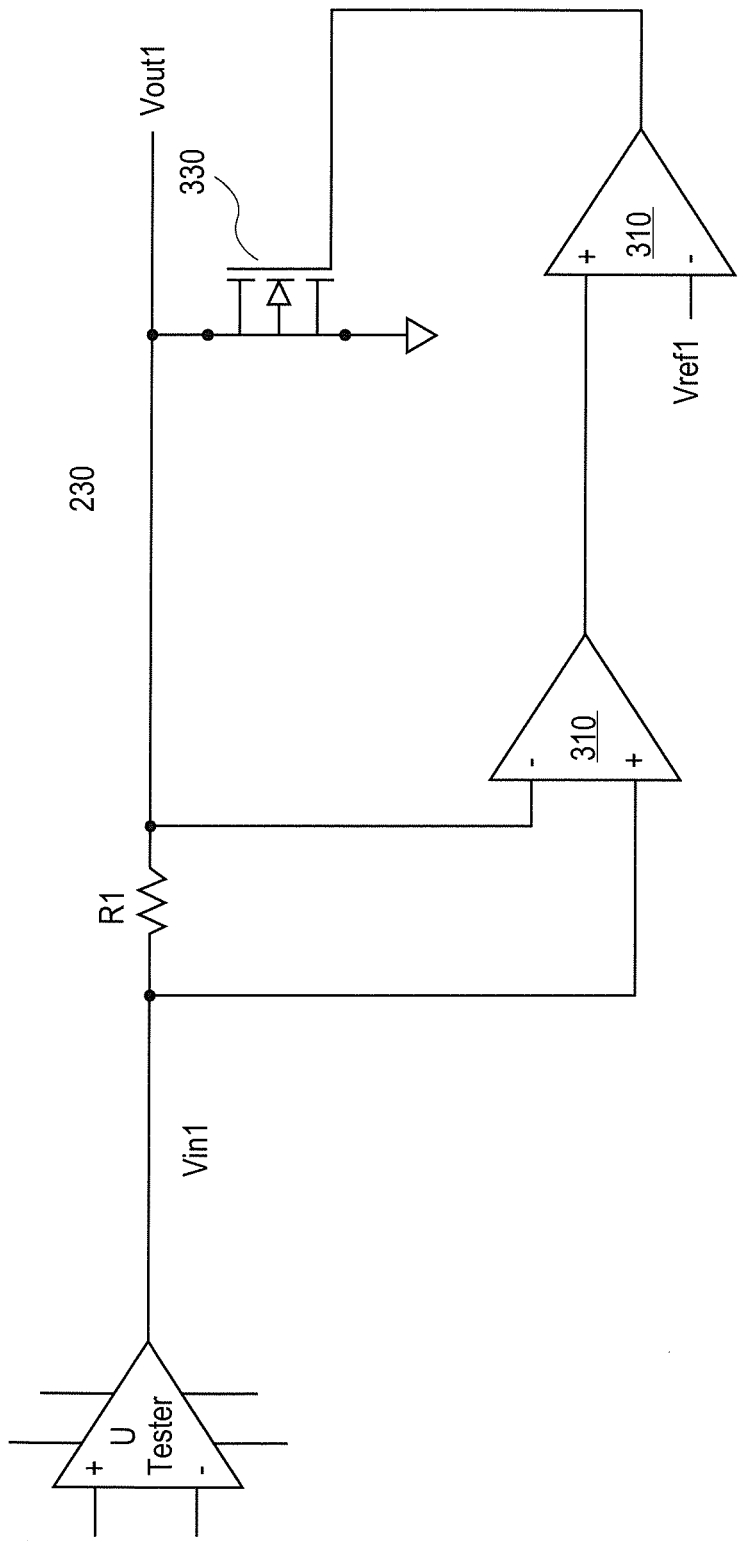
FIG. 3 illustrates one embodiment of a shunting e-fuse.

In one embodiment, shunting e-fuse 230 is coupled between a tester power supply 205 and probes 215. In such an embodiment, e-fuse 230 protects sort probes 215 against over current event. FIG. 3 illustrates one embodiment of shunting e-fuse 230, which includes current sense logic to indicate an over current condition.

According to one embodiment, current sense amplifier 310 includes a current sense amplifier 310, comparator 320 and power FET transistor 330. Current sense amplifier 310 implements a current-sense resistor (R1) to convert a load current received from the ATE system to a small voltage and amply the voltage for output to comparator 320.

Comparator 320 compares the amplified voltage from current sense amplifier 310 to a reference voltage (Vref). If the received voltage is greater than Vref, comparator 320 transmits a reference signal to power FET transistor 330, which forces the power supply to shunt to ground. Thus, the power supply is forced to shut down when an over current event is detected so that sort probes 215 are protected. In one embodiment, the circuit response time of shunting e-fuse 230 may be detuned by component selection or by adding an RC delay circuit to the amplifier output.

Referring back to FIG. 2, thermal fuse 240 includes a thermal element is implemented to disconnect probes 215 from power supply 205 upon being melted by heat attributed to an excessive current. In one embodiment, thermal fuse 240 is a fast response time 0.5 A thermal fuse in series on input/output (I/O) lines. Since I/O lines typically have a single non-redundant probe 215, thermal fuse 240 prevents non-repairable damage to a probe head due to an over current event. In a further embodiment, thermal fuse 240 is to be replaced after an over current occurrence.

Over current detector 250 and threshold detector circuit 255 are implemented to detect a real time over current occurrence at probes 215. During over current events, probe temperatures of between 200 C and 1500 C may be produced, which results in a hot probe 215. Hot probes produce light within the range of detection of a photodiode. Accordingly, over current detector 250 includes a photo diode placed near the probe 215 array to detect infrared (IR) and visible light emission from sort probes 215 due to joule heating.

Upon detecting IR and/or visible light, over current detector 250 transmits a signal to threshold detector circuit 255, which produces a signal to be transmitted to the ATE system to indicate a probe 215 over current condition. According to one embodiment, each over current detector 250 includes an amplifier that is monitored individually by ATE system I/Os via a threshold detector circuit 255. Further, the voltage magnitude and position of each detector may be used to provide real time information about the location and magnitude of the over current event.

Figure 4:
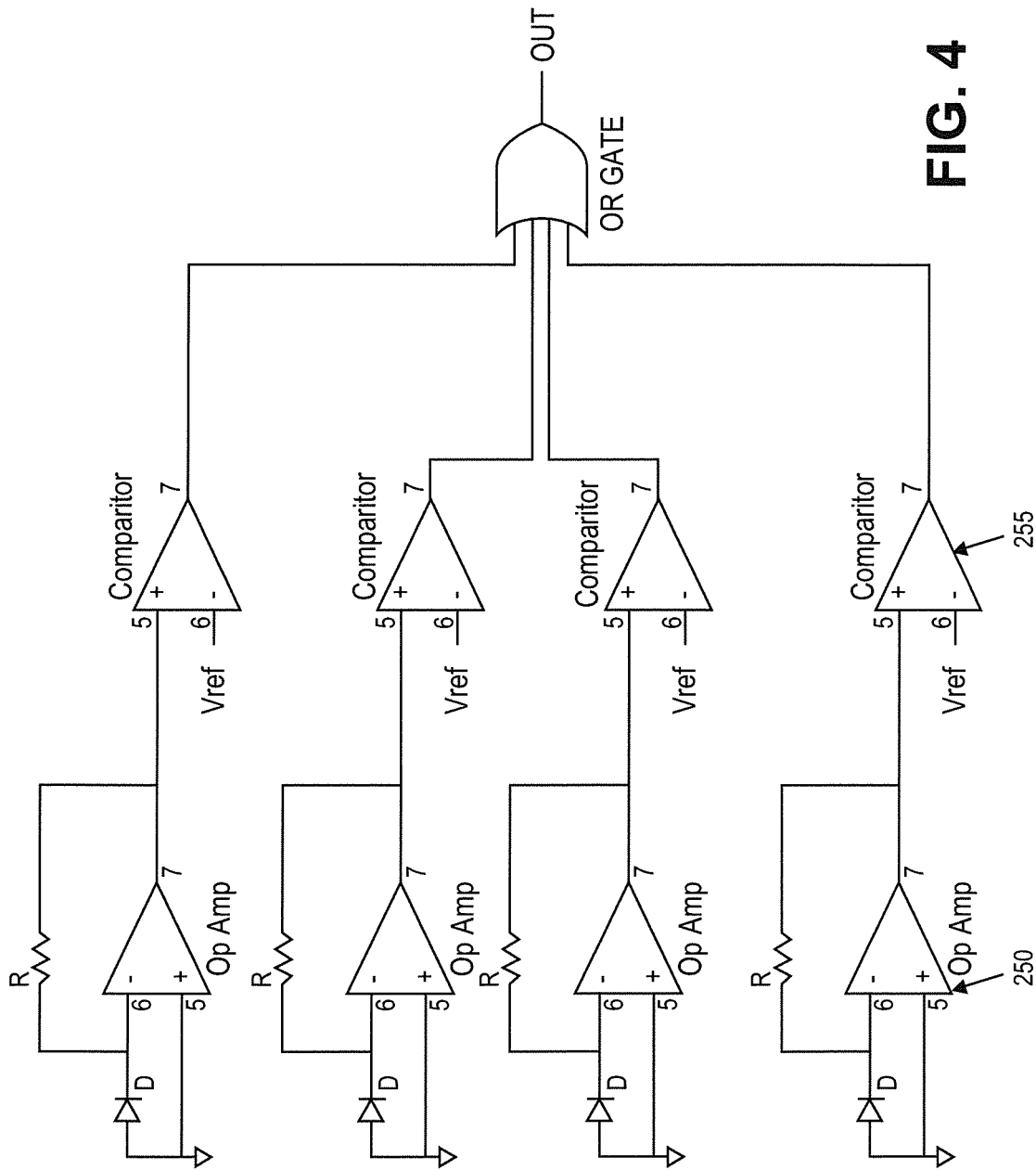
FIG. 4 illustrates one embodiment of a over current detection configuration.

In another embodiment, multiple current detectors 250 are routed through threshold detector circuits 255 and an OR-gate in order to produce a logic signal as an over current event occurs. In such an embodiment, the OR-gate or amplifier output signals are monitored with a test program through a tester channel or an external oscilloscope. Thus, root cause die would be identified as the over current event occurs. FIG. 4 illustrates one embodiment of such a configuration.

In a further embodiment, the ATE system may be programmed to respond by shutting down power supplies 205 (105 does not appear to be defined) and producing a bin signal or other responses that provide automated troubleshooting to identify the source of the over current. In yet another embodiment, the OR-gate output may be routed directly to shunting e-fuse 230, resulting in immediate probe protection and power supply shut down.

Figure 5:
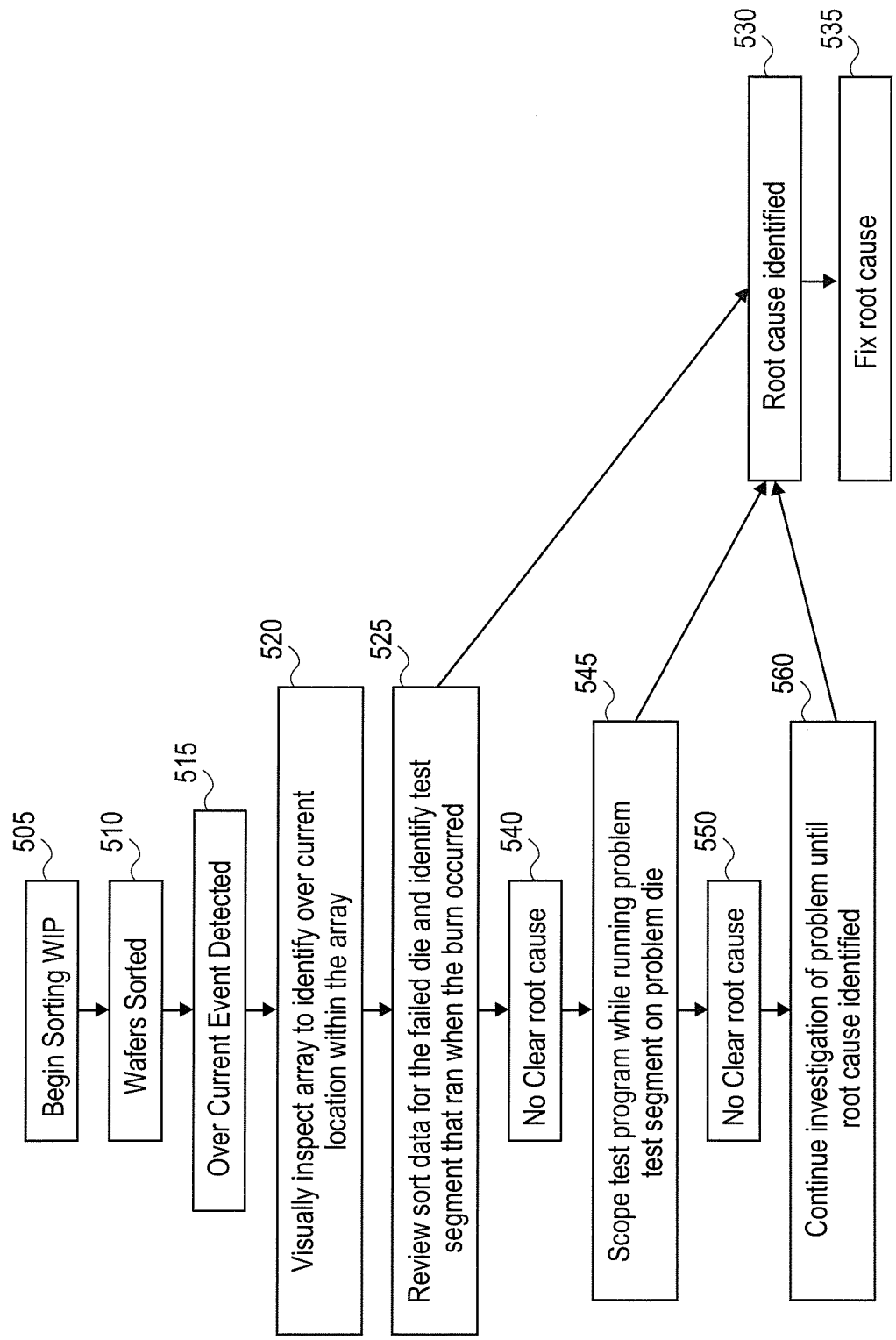
FIG. 5 is a flow diagram illustrating one embodiment for processing an over current event.

FIG. 5 is a flow diagram illustrating one embodiment for processing an over current event. At processing block 505, sorting is begun. At processing block 510, wafers are sorted. At processing block 515 an over current event is detected. At processing block 520, a visual inspection of the sort probe array is conducted to identify an over current location.

At processing block 525, sort data is reviewed for the failed die to identify a test segment running when the burn occurred. At processing block 525, a root cause is identified. At processing block 535, the root cause is fixed. If no root cause is found (processing block 540), a scope test program is run while running the problem test segment on the problem die. If the root cause continues to not be found (processing block 550), the investigation is continued (processing block 560) until the root cause is identified, processing block 530.

Figure 6:
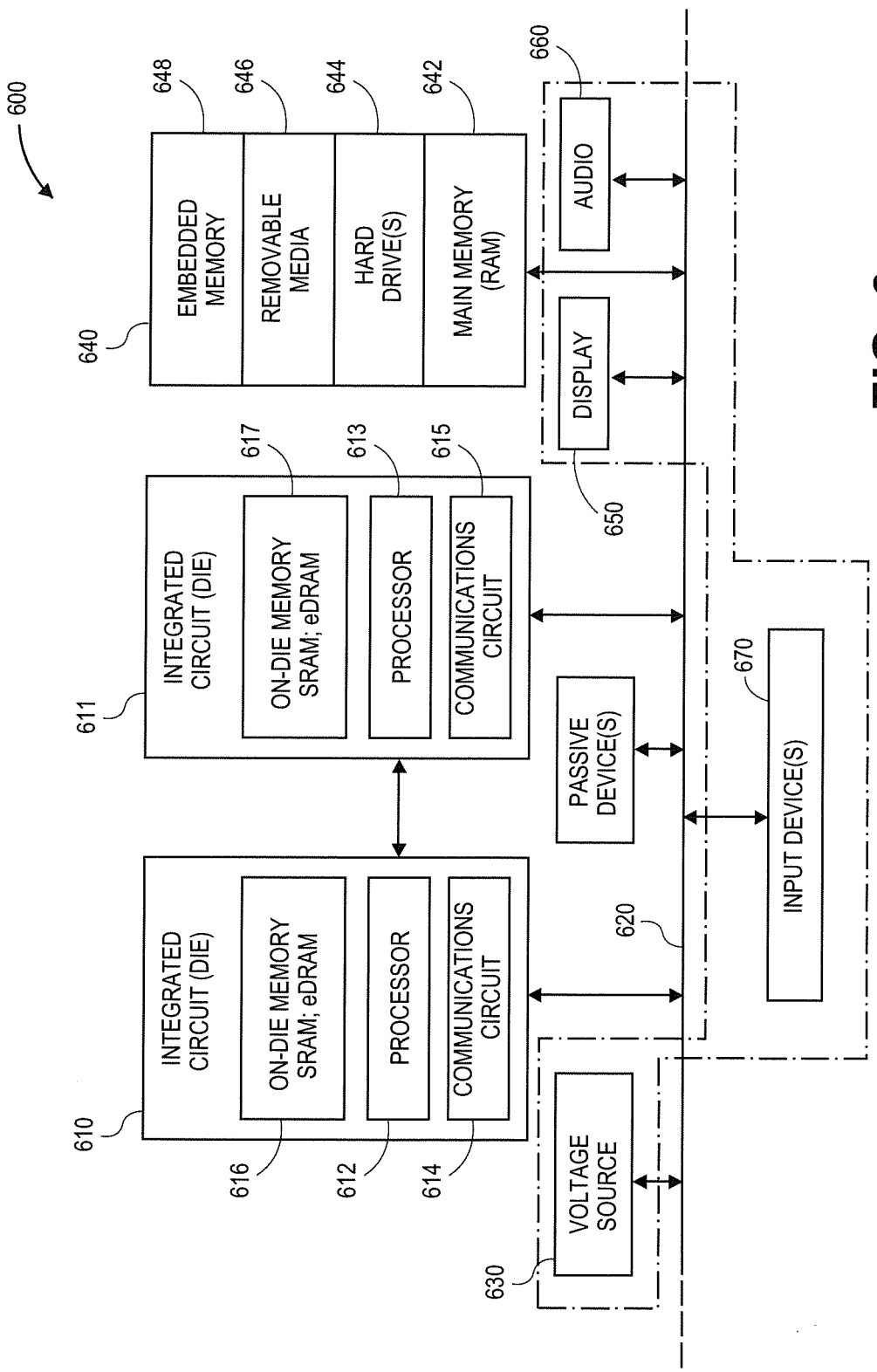
FIG. 6 illustrates one embodiment of a general-purpose electronic system.

FIG. 6 illustrates one embodiment of a computer system 600. The computer system 600 (also referred to as the electronic system 600) as depicted can embody a test system that includes an ATE system and a DUT to perform sequential burn-in testing.

The computer system 600 may be a mobile device such as a netbook computer. The computer system 600 may be a mobile device such as a wireless smart phone. The computer system 600 may be a desktop computer. The computer system 600 may be a hand-held reader. The computer system 600 may be a server system. The computer system 600 may be a supercomputer or high-performance computing system.

In an embodiment, the electronic system 600 is a computer system that includes a system bus 620 to electrically couple the various component blocks of the electronic system 600. The system bus 620 is a single bus or any combination of busses according to various embodiments. The electronic system 600 includes a voltage source 630 that provides power to the integrated circuit 610. In some embodiments, the voltage source 630 supplies current to the integrated circuit 610 through the system bus 620.

The integrated circuit 610 is electrically coupled to the system bus 620 and includes any circuit, or combination of circuits according to an embodiment. In an embodiment, the integrated circuit 610 includes a processor 612 that can be of any type. As used herein, the processor 612 may mean any type of circuit such as, but not limited to, a microprocessor, a microcontroller, a graphics processor, a digital signal processor, or another processor.

In an embodiment, SRAM embodiments are found in memory caches of the processor. Other types of circuits that can be included in the integrated circuit 610 are a custom circuit or an application-specific integrated circuit (ASIC), such as a communications circuit 614 for use in wireless devices such as cellular telephones, smart phones, pagers, portable computers, two-way radios, and similar electronic systems, or a communications circuit for servers.

In an embodiment, the integrated circuit 610 includes on-die memory 616 such as static random-access memory (SRAM). In an embodiment, the integrated circuit 610 includes embedded on-die memory 616 such as embedded dynamic random-access memory (eDRAM).

In an embodiment, the integrated circuit 610 is complemented with a subsequent integrated circuit 611. Useful embodiments include a dual processor 613 and a dual communications circuit 615 and dual on-die memory 617 such as SRAM. In an embodiment, the dual integrated circuit 610 includes embedded on-die memory 617 such as eDRAM.

In an embodiment, the electronic system 600 also includes an external memory 640 that in turn may include one or more memory elements suitable to the particular application, such as a main memory 642 in the form of RAM, one or more hard drives 644, and/or one or more drives that handle removable media 646, such as diskettes, compact disks (CDs), digital variable disks (DVDs), flash memory drives, and other removable media known in the art. The external memory 640 may also be embedded memory 648 such as the first die in an embedded TSV die stack, according to an embodiment.

In an embodiment, the electronic system 600 also includes a display device 650, an audio output 660. In an embodiment, the electronic system 600 includes an input device such as a controller 670 that may be a keyboard, mouse, trackball, game controller, microphone, voice-recognition device, or any other input device that inputs information into the electronic system 600. In an embodiment, an input device 670 is a camera. In an embodiment, an input device 670 is a digital sound recorder. In an embodiment, an input device 670 is a camera and a digital sound recorder.

As shown herein, the integrated circuit 610 can be implemented in a number of different embodiments, including a test system that includes an ATE system and a DUT to perform sequential burn-in testing, and their equivalents, an electronic system, a computer system, one or more methods of fabricating an integrated circuit, and one or more methods of fabricating an electronic assembly that includes a semiconductor die packaged according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed semiconductor die packaged with a thermal interface unit and their equivalents. A foundation substrate may be included, as represented by the dashed line of FIG. 6. Passive devices may also be included, as is also depicted in FIG. 6.

Although embodiments of the invention have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. An apparatus comprising:
   a probe card;
   a plurality of sort probes coupled to the probe card; and
   detector circuitry to detect a real time over current occurrence at the sort probes, including:

an over current detector to generate a signal upon detecting infrared (IR) or visible light emission from the one or more of the plurality of sort probes;
a threshold detector circuit to receive the signal and generate an over current signal to indicate that the one or more of the plurality of sort probes are in an over current event;
a second current detector placed near a second sort probe to detect IR and visible light emission from the second sort probe; and
a second threshold detector circuit to receive a second signal from the second current detector and generate a second over current signal to indicate that the second sort probe is in an over current event, wherein the voltage magnitude and position of the first current detector and the second current detector are used to provide real time information about the location and magnitude of the over current event.

2. The apparatus of claim 1 wherein the over current detector is a photo diode placed near a first sort probe to detect IR and visible light emission from the first sort probe.

3. The apparatus of claim 2 wherein the over current detector further comprises an amplifier.

4. The apparatus of claim 1 further comprising an OR-gate in order to receive the over current signals.

5. The apparatus of claim 4 further comprising a shunting fuse coupled between the one or more of the plurality of sort probes and a power supply to protect the one or more of the plurality of sort probes against an over current event.

6. The apparatus of claim 5 wherein the OR-gate output is routed directly to the shunting fuse.

7. A test system comprising:
an automated test equipment (ATE) system;
a probe card coupled to the ATE system;
a plurality of sort probes coupled to the probe card; and
an integrated circuit (IC) device coupled the probe card via the plurality of sort probes; and
detector circuitry to detect a real time over current occurrence at the sort probes, including:
an over current detector to generate a signal upon detecting infrared (IR) or visible light emission from the one or more of the plurality of sort probes;
a threshold detector circuit to receive the signal and generate an over current signal to indicate that the one or more of the plurality of sort probes are in an over current event;
a second current detector placed near a second sort probe to detect IR and visible light emission from the second sort probe; and
a second threshold detector circuit to receive a second signal from the second current detector and generate a second over current signal to indicate that the second sort probe is in an over current event, wherein the voltage magnitude and position of the first current detector and the second current detector are used to provide real time information about the location and magnitude of the over current event.

8. The test system of claim 7 wherein the over current detector is a photo diode placed near a first sort probe to detect IR and visible light emission from the first sort probe.

9. The test system of claim 8 wherein the over current detector further comprises an amplifier.

10. The test system of claim 7 further comprising an OR-gate in order to receive the over current signals.

11. The test system of claim 10 further comprising a shunting fuse coupled between the one or more of the plurality of sort probes and a power supply to protect the one or more of the plurality of sort probes against an over current event.

12. The test system of claim 11 wherein the OR-gate output is routed directly to the shunting fuse.

13. The test system of claim 7 wherein the shunting fuse is a fast response fuse.

* * * * *